US008878149B2

(12) United States Patent
Yashima

(10) Patent No.: US 8,878,149 B2
(45) Date of Patent: Nov. 4, 2014

(54) CHARGED PARTICLE BEAM WRITING APPARATUS AND CHARGED PARTICLE BEAM WRITING METHOD

(75) Inventor: Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 272 days.

(21) Appl. No.: 13/288,530

(22) Filed: Nov. 3, 2011

(65) Prior Publication Data

US 2012/0126145 A1 May 24, 2012

(30) Foreign Application Priority Data

Nov. 19, 2010 (JP) ................................. 2010-259061

(51) Int. Cl.
*G21G 5/00* (2006.01)
(52) U.S. Cl.
USPC .................. 250/492.3; 250/492.1; 250/492.2; 716/53; 716/55; 702/82
(58) Field of Classification Search
USPC ............ 250/492.1–492.3; 716/53, 55; 702/82
See application file for complete search history.

(56) References Cited

U.S. PATENT DOCUMENTS

| 7,601,968 | B2 | 10/2009 | Abe et al. | |
|---|---|---|---|---|
| 7,740,991 | B2 | 6/2010 | Emi et al. | |
| 8,065,635 | B2 | 11/2011 | Yashima et al. | |
| 8,103,980 | B2 | 1/2012 | Emi et al. | |
| 2004/0248045 | A1* | 12/2004 | Tanaka et al. | 430/312 |
| 2007/0136712 | A1* | 6/2007 | Hino | 716/11 |
| 2007/0192757 | A1* | 8/2007 | Emi et al. | 716/20 |
| 2008/0184190 | A1* | 7/2008 | Yashima et al. | 716/19 |
| 2009/0200488 | A1* | 8/2009 | Yashima et al. | 250/492.2 |
| 2010/0072390 | A1 | 3/2010 | Yashima | |
| 2010/0173235 | A1 | 7/2010 | Kato et al. | |
| 2010/0237253 | A1 | 9/2010 | Yashima | |
| 2011/0012031 | A1 | 1/2011 | Shibata et al. | |
| 2011/0046762 | A1 | 2/2011 | Yashima | |
| 2011/0291029 | A1 | 12/2011 | Yashima | |
| 2012/0001097 | A1 | 1/2012 | Yashima et al. | |

FOREIGN PATENT DOCUMENTS

| JP | 7-94376 A | 4/1995 |
|---|---|---|
| JP | 2009-32904 | 2/2009 |
| JP | 2010-129900 A | 6/2010 |

OTHER PUBLICATIONS

U.S. Appl. No. 13/765,140, filed Feb. 12, 2013, Kato, et al.
U.S. Appl. No. 13/647,665, filed Oct. 9, 2012, Kato, et al.
Korean Office Action Issued Nov. 19, 2012 in Patent Application No. 10-2011-0114324 (with English translation).

(Continued)

*Primary Examiner* — Michael Maskell
(74) *Attorney, Agent, or Firm* — Oblon, Spivak, McClelland, Maier & Neustadt, L.L.P.

(57) ABSTRACT

A charged particle beam writing apparatus includes a storage unit configured to store writing data in which there are defined a plurality of figures and resizing information indicating, with respect to each of the plurality of figures, a resizing status whether or not to perform resizing and a resizing direction used when performing resizing, a judgment determination unit configured to input the writing data and judge, with respect to each of the plurality of figures, the resizing status whether or not to perform resizing and the resizing direction used when performing resizing, a resize processing unit configured to resize, with respect to each of the plurality of figures, a dimension of a figure concerned in a judged resizing direction when it is judged to perform resizing, and a writing unit configured to write a pattern onto a target workpiece with using a resized figure and a charged particle beam.

10 Claims, 9 Drawing Sheets

(56) References Cited

OTHER PUBLICATIONS

U.S. Appl. No. 13/235,432, filed Sep. 18, 2011, Nakayamada, et al.
U.S. Appl. No. 13/275,448, filed Oct. 18, 2011, Yashima, et al.
U.S. Appl. No. 13/323,986, filed Dec. 13, 2011, Emi, et al.
U.S. Appl. No. 13/349,002, filed Jun. 12, 2012, Yashima, et al.
Office Action issued Apr. 15, 2014 in Japanese Patent Application No. 2010-259061 (with English language translation).

* cited by examiner

| Figure Data (Shape, Position, Size), | Resizing Information |

0001  0011  0010

There Is Figure At Right   There Is Figure At Left   Not Resizing At Contacting Side

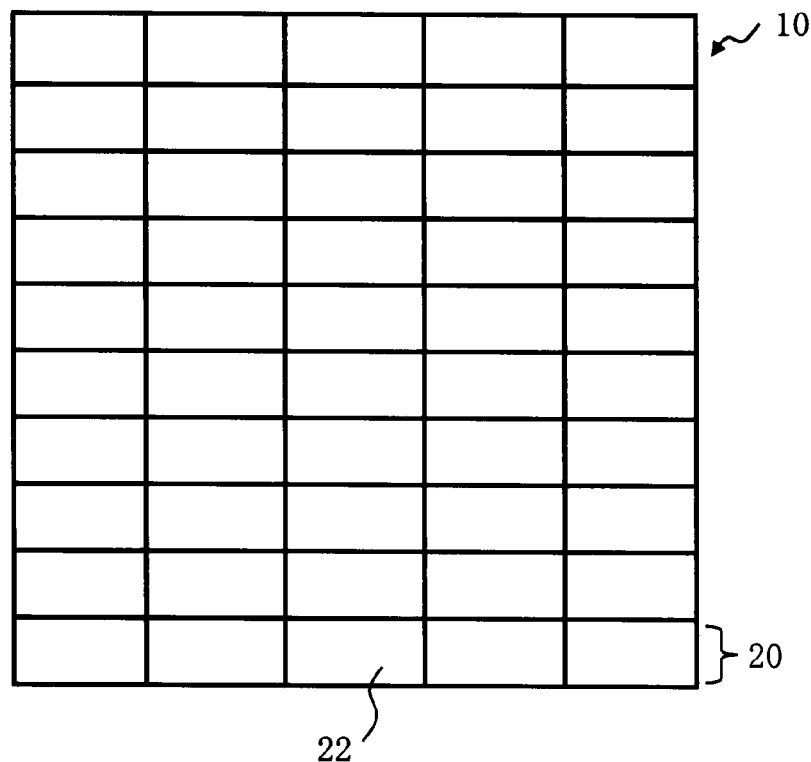
FIG. 5
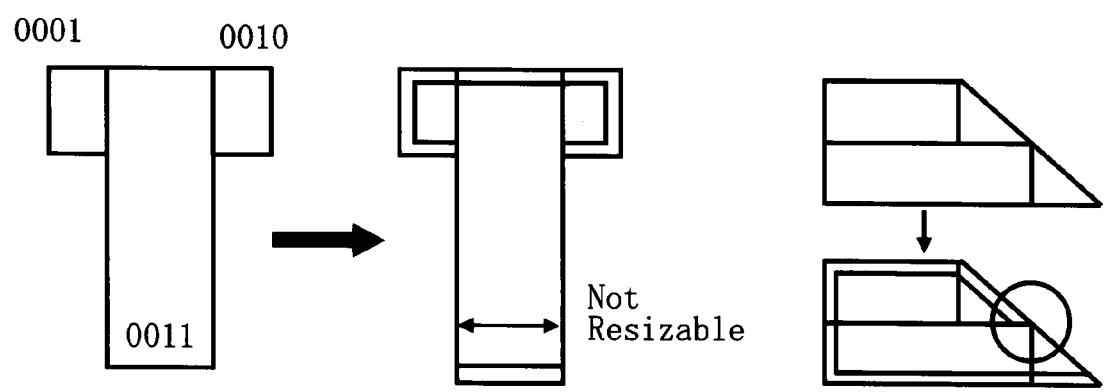
FIG. 6A
FIG. 6B

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2010-259061 filed on Nov. 19, 2010 in Japan, the entire contents of which are incorporated herein by reference.

BACKGROUND OF THE INVENTION

1. Field of the Invention

The present invention relates to a charged particle beam writing apparatus and a charged particle beam writing method. For example, it relates to an apparatus and a method for resizing pattern dimensions.

2. Description of Related Art

The microlithography technique which advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 11 is a schematic diagram for explaining operations of a variable-shaped electron beam (EB) writing apparatus. As shown in the figure, the variable-shaped electron beam writing apparatus operates as described below. A first aperture plate 410 has a quadrangular, such as a rectangular, opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 410, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

With regard to figures serving as writing targets, since there are various types of the figures, generally, writing data which has been divided according to the type of figure that can be shaped by the writing apparatus is input into the apparatus. Therefore, figures in contact with adjacent figures are defined as the writing data. Moreover, in the electron beam writing, there has been used a method of writing by using a figure pattern the shape of which has been previously resized considering a dimension variation due to a phenomenon, not depending on a dose of an electron beam, such as a loading effect etc. Such resize processing has been performed before being input into the writing apparatus (refer to e.g., Japanese Patent Application Laid-open (JP-A) No. 2009-032904).

BRIEF SUMMARY OF THE INVENTION

In accordance with one aspect of the present invention, a charged particle beam writing apparatus includes a storage unit configured to store writing data in which there are defined a plurality of figures and resizing information indicating, with respect to each of the plurality of figures, a resizing status whether or not to perform resizing and a resizing direction used when performing resizing, a judgment determination unit configured to input the writing data and judge, with respect to each of the plurality of figures, the resizing status whether or not to perform resizing and the resizing direction used when performing resizing, a resize processing unit configured to resize, with respect to each of the plurality of figures, a dimension of a figure concerned in a judged resizing direction when it is judged to perform resizing, and a writing unit configured to write a pattern onto a target workpiece with using a resized figure and a charged particle beam.

In accordance with another aspect of the present invention, a charged particle beam writing apparatus includes a storage unit configured to store writing data in which there are defined a plurality of figures and contacting direction information indicating, with respect to each of the plurality of figures, a direction of contacting with an adjacent figure, a judgment determination unit configured to input the writing data and judge, with respect to each of the plurality of figures, the direction of contacting with the adjacent figure by using the contacting direction information, a resize processing unit configured to resize, with respect to each of the plurality of figures, a dimension of a figure concerned in a direction other than a judged direction, and a writing unit configured to write a pattern onto a target workpiece with using a resized figure and a charged particle beam.

In accordance with another aspect of the present invention, a charged particle beam writing method includes storing, in a storage unit, writing data in which there are defined a plurality of figures and resizing information indicating, with respect to each of the plurality of figures, a resizing status whether or not to perform resizing and a resizing direction used when performing resizing, reading the writing data from the storage unit, and judging, with respect to each of the plurality of figures, the resizing status whether or not to perform resizing and the resizing direction used when performing resizing, resizing, with respect to each of the plurality of figures, a dimension of a figure concerned in a judged resizing direction when it is judged to perform resizing, and writing a pattern onto a target workpiece with using a resized figure and a charged particle beam.

In accordance with another aspect of the present invention, a charged particle beam writing method includes storing, in a storage unit, writing data in which there are defined a plurality of figures and contacting direction information indicating, with respect to each of the plurality of figures, a direction of contacting with an adjacent figure, reading the writing data from the storage unit, and judging, with respect to each of the plurality of figures, the direction of contacting with the adjacent figure by using the contacting direction information, resizing, with respect to each of the plurality of figures, a dimension of a figure concerned in a direction other than a judged direction, and writing a pattern onto a target workpiece with using a resized figure and a charged particle beam.

BRIEF DESCRIPTION OF THE DRAWINGS

FIG. 5 is a schematic diagram showing an example in which a writing region is divided into blocks according to Embodiment 1;

FIGS. 6A and 6B are schematic diagrams showing an example of a pattern with difficulty in performing resizing, according to Embodiment 2;

DETAILED DESCRIPTION OF THE INVENTION

As described above, the resize processing has been performed before writing data is input into the writing apparatus. However, there is requested to perform the resize processing in the writing apparatus. Writing data input into the writing apparatus is configured by data indicating the position, the shape, the size, etc. of a respective figure. If the resize processing based on such writing data is performed in the writing apparatus, the problem described below will occur.

Figures 12A, 12B, 12C:
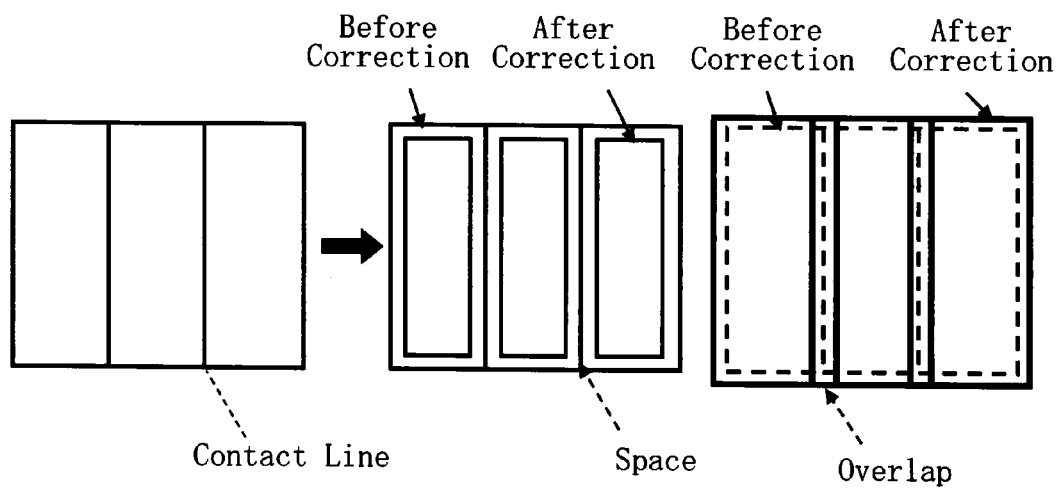
FIGS. 12A to 12C are schematic diagrams for explaining a problem of resize processing.

FIGS. 12A to 12C are schematic diagrams for explaining a problem of resize processing. When three adjacent rectangles are contactingly arranged as shown in FIGS. 12A to 12C, the position, the shape, and the size of each rectangle are represented in the writing data. However, it is not discernible whether the adjacent figures should be in a contact state even after performing resizing. Therefore, in the case of dimensions being resized just using such data with respect to each figure, a problem occurs in that if the resizing is performed to make the dimensions smaller, a space is made between the figures that should originally contact with each other. Conversely, if the resizing is performed to make the dimensions larger, a problem occurs in that figures overlap with each other. However, conventionally, an efficient method for solving this problem has not been established yet.

In the following embodiments, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

In the following Embodiments, there will be described an apparatus and a method capable of performing resizing of figure dimensions in the writing apparatus.

Embodiment 1

Figure 1:
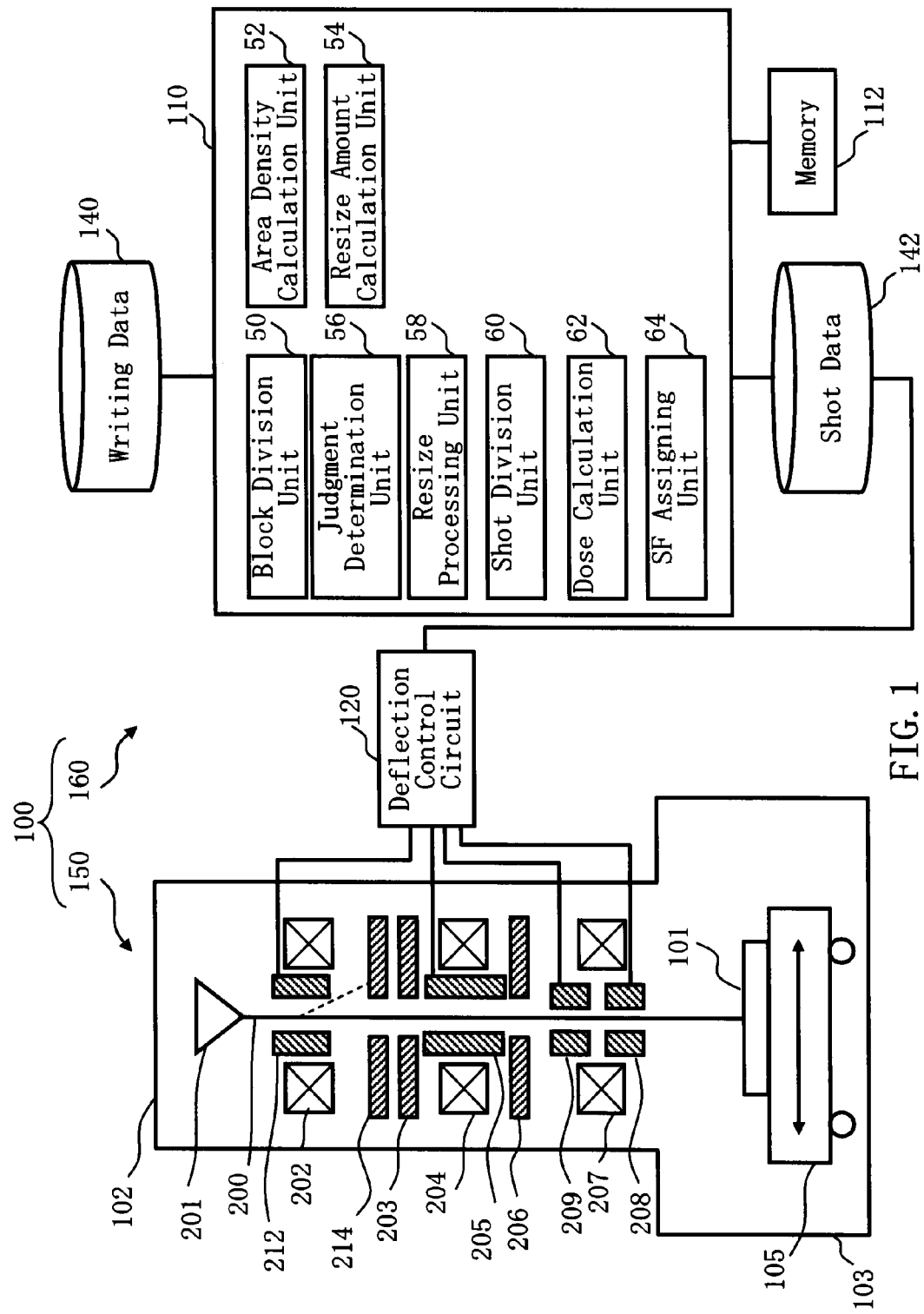
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 includes a writing unit 150 and a control unit 160. The writing apparatus 100 (or drawing apparatus 100) writes (or draws) a pattern on the target workpiece 101. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector (blanker) 212, a blanking aperture 214, a first shaping aperture 203, a projection lens 204, a deflector 205, a second shaping aperture 206, an objective lens 207, a main deflector 208, and a sub deflector 209. In the writing chamber 103, there is arranged an XY stage 105 that is movable at least in the XY direction. On the XY stage 105, there is placed a target workpiece 101 serving as a writing target with resist applied. The target workpiece 101 is, for example, a mask for exposure, a silicon wafer, etc. used for manufacturing semiconductor devices. The mask is, for example, a mask blank where no patterns are formed.

The control unit 160 includes a control computer 110, a memory 112, a deflection control circuit 120, and storage devices 140 and 142 such as a magnetic disk drive. The control computer 110, the memory 112, the deflection control circuit 120, and the storage devices 140 and 142 are mutually connected through a bus (not shown). The deflection control circuit 120 is connected to each deflector.

Moreover, in the control calculator 110, there are arranged a block division unit 50, an area density calculation unit 52, a resize amount calculation unit 54, a judgment determination unit 56, a resize processing unit 58, a shot division unit 60, a dose calculation unit 62, and a subfield (SF) assigning unit 64. Each function of the above units may be configured by software such as a program, or may be configured by hardware such as an electronic circuit. Alternatively, it may be configured by a combination of software and hardware. Input data to be necessary in the control computer unit 110 and a calculated result are stored in the memory 112 each time.

FIG. 1 shows a structure necessary for describing Embodiment 1. Other structure elements generally necessary for the writing apparatus 100 may also be included.

According to Embodiment 1, resize processing of figures to be written is performed in the writing apparatus. A dimension variation of a figure pattern can be corrected by performing the resize processing. In particular, it is more suitable for correcting a pattern dimension variation caused by phenomena not due to a dose amount, such as a loading effect, a micro loading effect, and a flare effect. By making it possible to perform resize processing in the writing apparatus, it becomes unnecessary for the user side to perform the resize processing in advance.

Figure 2:
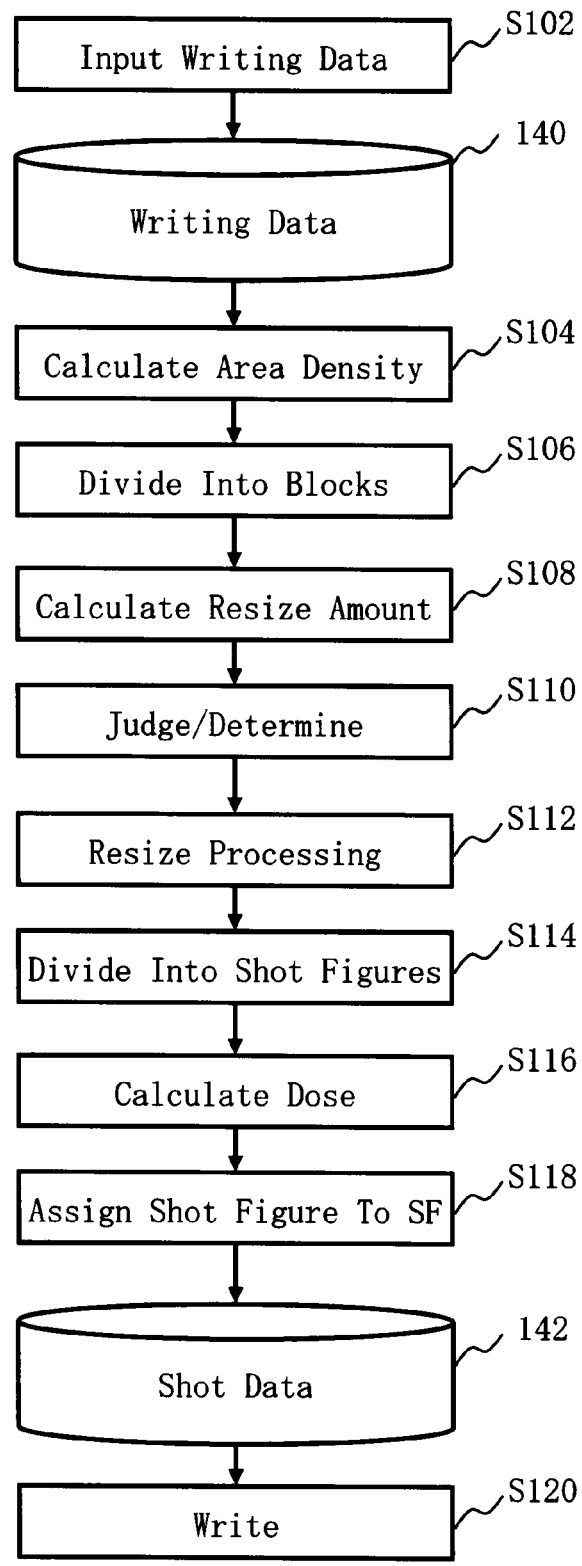
FIG. 2 is a flowchart showing main steps of a writing method according to Embodiment 1.

FIG. 2 is a flowchart showing main steps of a writing method according to Embodiment 1. In FIG. 2, the writing method of Embodiment 1 executes a series of steps: a writing data input step (S102), an area density calculation step (S104), a block division step (S106), a resize amount calculation step (S108), a judgment determination step (S110), a resize processing step (S112), a shot division step (S114), a dose calculation step (S116), an SF assignment step (S118) and a writing step (S120). In FIG. 2, although the SF assignment step (S118) is shown after the dose calculation step (S116), it is not limited thereto and it may be implemented before the shot division step (S114).

Figures 3, 4A, 4B:
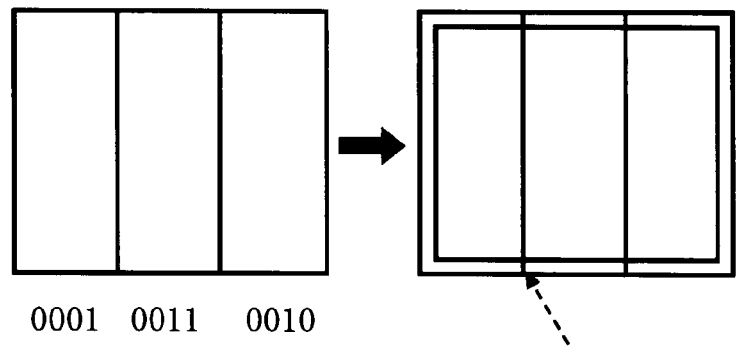
FIG. 3 is a schematic diagram for explaining a format of writing data according to Embodiment 1.
FIGS. 4A and 4B are schematic diagrams for explaining resizing information according to Embodiment 1.

FIG. 3 is a schematic diagram for explaining a format of writing data according to Embodiment 1. As shown in FIG. 3, information indicating the position, the shape, and the size of each figure is defined in writing data to be input into the writing apparatus 100 from the outside, and further, according to Embodiment 1, resizing information is further defined in addition to such data. That is, writing data with the added resizing information is input from the outside of the writing apparatus 100 and stored (memorized) in the storage device 140.

FIGS. 4A and 4B are schematic diagrams for explaining the resizing information according to Embodiment 1. FIG. 4A shows three figures which adjacently contact with each other, as an example. As information for defining these figures, in addition to the information indicating the position, the shape, and the size of each figure, there is also added information for judging contact (an example of resizing information) through which a contact status can be judged. For example, a four-bit flag is given to every figure. Each of the four-bit values respectively shows a contact status, whether or not the figure concerned contacts with the adjacent figure at the upper side, lower side, left side or right side. In the adjacently contacting three figures, for example, with respect to the left side figure, four-bit data of "0001" indicating that there is a contacting figure at its right side is given to it. On the other hand, with respect to the right side figure, four-bit data of "0010" indicating that there is a contacting figure at its left side is given to it. With respect to the center figure, four-bit data of "0011" indicating that there are contacting figures at its right and left sides is given to it. Although not shown, in the case of there being a contacting figure at the upper side, four-bit data of "1000" is given. In the case of there being a contacting figure at the lower side, four-bit data of "0100" is given. In the case of there being contacting figures at the upper and lower sides, four-bit data of "1100" is given. In the case of there being contacting figures at the upper, lower, left and right sides, four-bit data of "1111" is given. Then, if a condition is set that no resizing is performed with respect to a side where a contacting figure exists, even when resizing to make dimensions smaller is carried out in the writing apparatus 100, the problem can be avoided that a space opens between figures that should contact with each other. Similarly, when performing resizing to make dimensions larger, the problem that figures overlap each other can also be avoided.

In the writing data input step (S102), the storage device 140 stores writing data in which there are defined a plurality of figures and resizing information that indicates, for each of the figures, a resizing status whether or not to perform resizing and a resizing direction used when performing resizing.

In the area density calculation step (S104), the area density calculation unit 52 calculates an area density of a pattern in each of a plurality of mesh regions of a predetermined size, which are made by virtually dividing the writing region of the target workpiece 101 into mesh-like regions. As a mesh size, about 1 mm to 2 mm is suitable, for example.

In the block division step (S106), the block division unit 50 divides the writing region of the target workpiece 101 into block regions each serving as a unit of data processing.

FIG. 5 is a schematic diagram showing an example in which a writing region is divided into blocks according to Embodiment 1. The writing region 10 of the target workpiece 101 is virtually divided into a plurality of strip-like stripe regions 20 in the X direction or the Y direction, each having a width deflectable by the main deflector 208. The writing processing is performed for each stripe region. Each stripe region is divided into the block regions 22 each serving as a unit of data processing. Henceforth, the data processing of writing data is performed for each block region 22.

In the resize amount calculation step (S108), the resize amount calculation unit 54 calculates an amount of resizing of dimensions of each figure. A resize amount $\Delta l(k,l)$ for the figure in the mesh region of coordinates (k,l) can be defined by the following equation (1).

$$\Delta l(k,l) = \Sigma e(i,j)(k,l) \tag{1}$$

In this case, $e(i,j)(k,l)$ indicates an influence quantity relating to the influence from the mesh region of coordinates (i,j) to the mesh region of coordinates (k,l). Based on the equation (1), all the influence quantities relating to influences from all the mesh regions of coordinates (i,j) within the influence range to the mesh regions of coordinates (k,l) are cumulatively added (integrated). $e(i,j)(k,l)$ can be defined by the following equation (2).

$$e(i,j)(k,l) = \delta \cdot Aij/x(i,j)(k,l) \tag{2}$$

In this case, $\delta$ indicates a coefficient, Aij does an area density of the coordinates (i,j), and $x(i,j)(k,l)$ does a distance from the coordinates (i,j) to the coordinates (k,l).

In the judgment determination step (S110), the judgment determination unit 56 inputs writing data, and judges, with respect to each figure, the direction of contacting with an adjacent figure by using contacting direction information. In the example of FIG. 4A, since the resizing information (contacting direction information) of "0001" is defined for the left side figure, it is judged that there is a contacting figure at its right side. On the other hand, since the resizing information (contacting direction information) of "0010" is defined for the right side figure, it is judged that there is a contacting figure at its left side. Further, since the resizing information (contacting direction information) of "0011" is defined for the center figure, it is judged that there are contacting figures at both its left side and right side.

In the resize processing step (S112), the resize processing unit 58, with respect to each figure, performs resizing of dimensions of the figure concerned in the direction other than the judged contacting direction. A calculated resize amount is used for the resizing. In the example of FIG. 4A, with respect to the left side figure, resizing is performed for the dimensions of its upper, lower, and left sides except for the right side. With respect to the right side figure, resizing is performed for the dimensions of its upper, lower, and right sides except for the left side. With respect to the center figure, resizing is performed for the dimensions of its upper and lower sides except for the left and right sides. By this resize processing, since the resizing is not performed for the contacting sides, the contacting state with the adjoining figures can be maintained as shown in FIG. 4B. Accordingly, even if a loading effect etc. occurs due to the etching processing etc. after the writing, a figure without a space or an overlap can be formed as shown in FIG. 4B.

In the shot division step (S114), the shot division unit 60 divides each figure into a plurality of shot figures each having a size which can be formed by one shot of the electron beam 200.

In the dose calculation step (S116), the dose calculation unit 62 calculates, for each shot figure, a dose of irradiation of the electron beam 200.

In the SF assignment step (S118), the SF assigning unit 64 assigns the shot figure concerned to each of a plurality of SFs made by virtually dividing the writing region of the target workpiece 101 into mesh-like regions each having a size deflectable by the subdeflector 209. Data for each shot (shot data) generated as described above is temporarily stored in the storage device 142 one by one in order of generation.

In the writing step (S120), first, the deflection control circuit 120 reads shot data, and outputs a deflection voltage of a deflection amount necessary for each deflector according to the shot data. By combining each shot figure, the writing unit 150 writes a resized figure pattern. Thus, the writing unit 150 writes the figure pattern concerned onto the target workpiece 101 with using a resized figure and an electron beam. Specifically, the writing unit 150 operates as follows:

When passing through the blanking deflector 212, the electron beam 200 emitted from the electron gun assembly 201 (emission unit) is controlled by the blanking deflector 212 to pass through the blanking aperture 214 when the beam is in the ON state, and is deflected so that the entire beam may be blocked by the blanking aperture 214 when the beam is in the OFF state. The electron beam 200 passing through the blanking aperture 214, while changing the state from beam-OFF to beam-ON and lastly again to beam-OFF, serves as one shot of the electron beam. The blanking deflector 212 controls the direction of the passing electron beam 200 to alternately generate the beam-ON state and the beam-OFF state. For example, it is acceptable to apply a voltage to the blanking deflector 212 when in the beam-OFF state and not to apply a voltage when in the beam-ON state. The dose per shot of the electron beam 200 to irradiate the target workpiece 101 is adjusted depending upon the irradiation time of each shot.

As described above, each shot of the electron beam 200, generated by passing through the blanking deflector 212 and the blanking aperture 214, irradiates the whole of the first shaping aperture 203 which has a quadrangular opening such as a rectangular opening by the illumination lens 202. Here, the electron beam 200 is first shaped to be a quadrangle such as a rectangle. Then, after having passed through the first shaping aperture 203, the electron beam 200 of a first aperture image is projected onto the second shaping aperture 206 by the projection lens 204. The first aperture image on the second shaping aperture 206 is deflection-controlled by the deflector 205 so as to change the shape and size of the beam (variable shaping). Such variable beam shaping is performed for each shot, and, usually, each of the shots is shaped to have a different shape and size. After having passed through the second shaping aperture 206, the electron beam 200 of a second aperture image is focused by the objective lens 207, and deflected by the main deflector 208, and the sub deflector 209 to reach a desired position on the target workpiece 101 placed on the XY stage 105 which moves continuously. As described above, a plurality of shots of the electron beam 200 are deflected in order by a respective deflector onto the target workpiece 101 serving as a substrate.

As described above, by adding resizing information to the writing data to be input, it becomes possible to perform figure dimension resizing in the writing apparatus without producing the problem, such as a space between figures or an overlap between them.

Embodiment 2

In Embodiment 1, there has been described a method of performing resizing in the writing apparatus by adding resizing information to each figure data, through which a contact status with other figures can be judged. However, it is not limited thereto.

FIGS. 6A and 6B are schematic diagrams, according to Embodiment 2, showing an example of a pattern with difficulty in performing resizing. In FIG. 6A, the center figure has a vertical dimension longer than that of the adjacent right and left figures. Thus, the center figure of the three figures of FIG. 6A contacts the adjacent figures along only a part of its right and left sides respectively. Therefore, when performing resize processing according to the method of Embodiment 1, it is impossible for the center figure to horizontally perform resize processing of rightward and leftward dimension. Similarly, in the case of a trapezoid divided into a plurality of figures as shown in FIG. 6B, since resizing is not performed in the direction of contacting side, it results in producing un-evenness at the oblique side.

Figure 7:
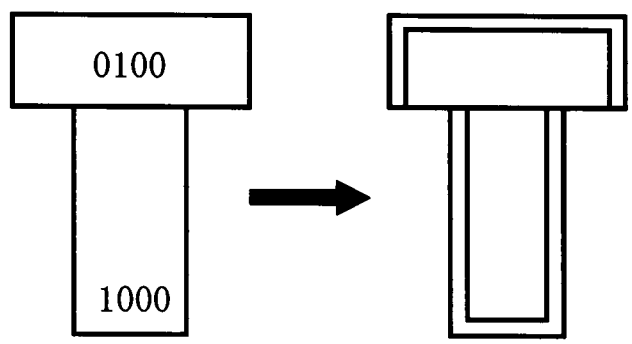
FIG. 7 is a schematic diagram showing another example of a pattern with difficulty in performing resizing according to Embodiment 2.

FIG. 7 is a schematic diagram, according to Embodiment 2, showing another example of a pattern with difficulty in performing resizing. Although FIG. 7 is originally the same as FIG. 6A, the way of dividing the figure is different from each other. In the case of FIG. 7, the figure is divided into two rectangles, the upper one and the lower one. When performing resize processing by the method of Embodiment 1, since the rectangles in FIG. 7 contact with each other one above the other, the position of the upper side of the lower figure cannot be resized. Similarly, the position of the lower side of the upper figure cannot be resized, either. Thus, though FIG. 6A and FIG. 7 are originally the same as each other, when the method of dividing differs from each other, figures after the resizing will be different.

Then, according to Embodiment 2, not information indicating a contacting direction but information indicating a resizing status whether or not to perform resizing and a resizing direction used when performing resizing is added to each figure as resizing information. The structure of the writing apparatus of Embodiment 2 is the same as that of FIG. 1 of Embodiment 1. Moreover, the flowchart of the writing method of Embodiment 2 is the same as that of FIG. 2 of Embodiment 1. Furthermore, the contents except for the contents specifically described below are the same as those of Embodiment 1.

Figure 8:
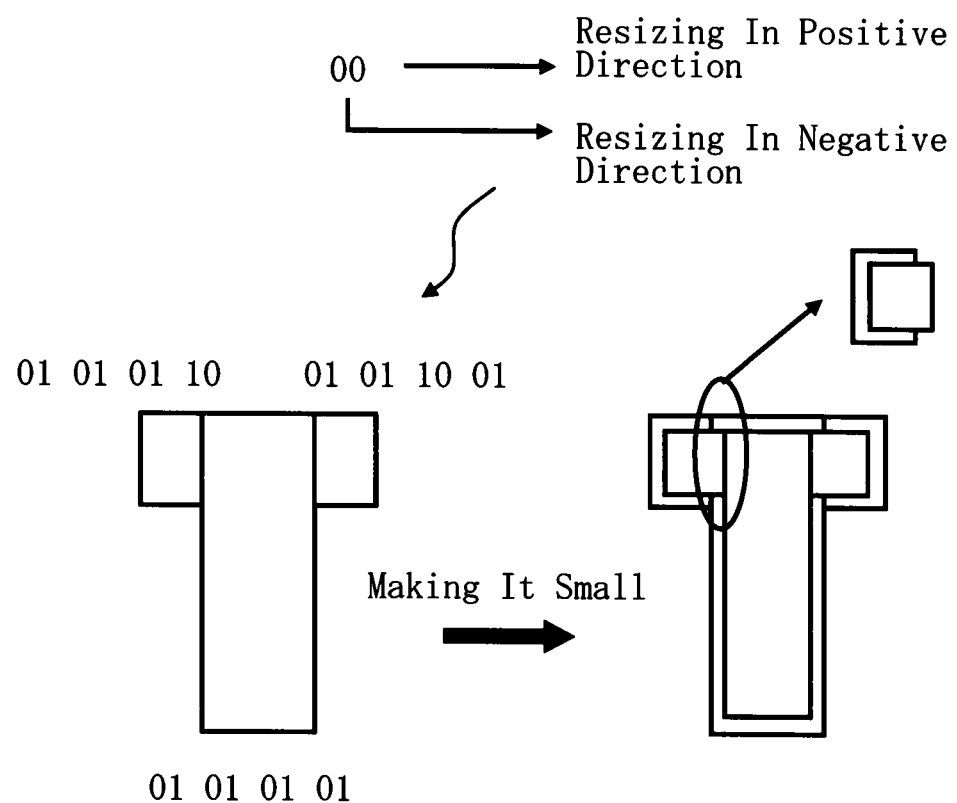
FIG. 8 is a schematic diagram for explaining an example of resizing information according to Embodiment 2.

FIG. 8 is a schematic diagram for explaining an example of resizing information according to Embodiment 2. Three adjacent figures are shown in FIG. 8 as an example. The vertical dimension of the center figure is longer than that of the adjacent right and left figures. As information for defining the figure, in addition to information indicating the position, the shape, and the size of the figure, there is added resizing information through which a resizing status whether or not to perform resizing and a resizing direction used when performing resizing can be judged. Here, for example, with respect to resizing direction, the direction which makes the dimension small is defined to be positive. For example, an eight-bit flag is given to each figure. Per two bits of the eight bits, there is indicated resizing information on the upper, lower, right, and left sides, respectively. "10" indicates to perform resizing in the negative direction with respect to the resizing direction. On the contrary, "01" indicates to perform resizing in the positive direction with respect to the resizing direction. "00" indicates not to perform resizing. With respect to the left side figure in the three adjacent figures, two-bit data of "01" indicating to perform resizing in the positive direction is provided for the upper side, two-bit data of "01" indicating to perform resizing in the positive direction is provided for the lower side, two-bit data of "01" indicating to perform resizing in the positive direction is provided for the left side, and two-bit data of "10" indicating to perform resizing in the negative direction is provided for the right side. With respect to the right side figure in the three adjacent figures, two-bit data of "01" indicating to perform resizing in the positive direction is provided for the upper side, two-bit data of "01" indicating to perform resizing in the positive direction is provided for the lower side, two-bit data of "10" indicating to perform resizing in the negative direction is provided for the left side, and two-bit data of "01" indicating to perform resizing in the positive direction is provided for the right side. With respect to the center figure, two-bit data of "01" indicating to perform resizing in the positive direction is respectively provided for each of the upper, lower, left, and right sides. By performing resizing based on the data described above, the contact between the contacting sides can be maintained by resizing the position of the right side of the left figure in the negative direction by the amount of resizing the contacting side of the center figure in the positive direction. Similarly, the contact between the contacting sides can be maintained by resizing the position of the left side of the right figure in the negative direction by the amount of resizing the contacting side of the center figure in the positive direction.

Figure 9:
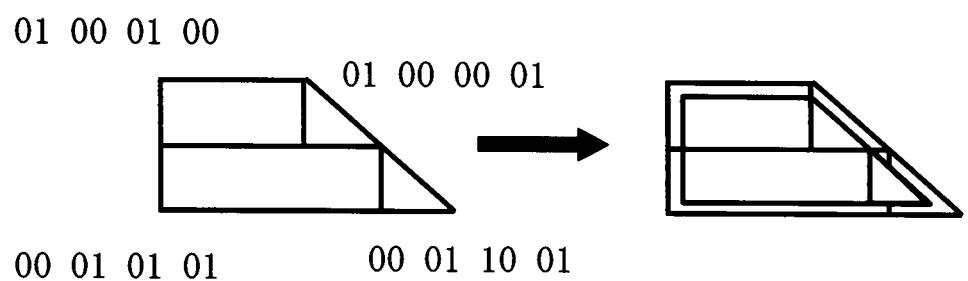
FIG. 9 is a schematic diagram for explaining another example of resizing information according to Embodiment 2.

FIG. 9 is a schematic diagram for explaining another example of resizing information according to Embodiment 2. FIG. 9 shows, as an example, a trapezoid divided into four adjacent figures contacting with each other one above the other shown in FIG. 6B. Both the right side figure of the upper figure and the right side figure of the lower figure are triangles configuring an oblique side of the trapezoid. In the example of FIG. 9, with respect to the upper left figure, "01" indicating to perform resizing in the positive direction is provided for the position of the upper side, "00" indicating not to perform resizing is provided for the position of the lower side, "01" indicating to perform resizing in the positive direction is provided for the position of the left side, and "00" indicating not to perform resizing is provided for the position of the right side. With respect to the upper right figure, "01" indicating to perform resizing in the positive direction is provided for the positions of the upper side and the right side, and "00" indicating not to perform resizing is provided for the positions of the lower side and the left side. With respect to the lower left figure, "00" indicating not to perform resizing is provided for the position of the upper side, and "01" indicating to perform resizing in the positive direction is provided for the positions of the lower side, the left side, and the right side. With respect to the lower right figure, "00" indicating not to perform resizing is provided for the position of the upper side, "01" indicating to perform resizing in the positive direction is provided for the positions of the lower side and the right side, and "10" indicating to perform resizing in the negative direction is provided for the position of the left side. By performing resizing based on the data described above, when both the positions of the oblique sides of the right upper and the right lower triangles are resized in the positive direction, the position of the right side of the lower left rectangle is also resized in the positive direction, thereby avoiding producing un-evenness at the oblique side.

In Embodiment 2, each of the steps from the writing data input step (S102) to the resize amount calculation step (S108) is the same as that of Embodiment 1.

In the judgment determination step (S110), the judgment determination unit 56 inputs writing data and judges, for each figure, a resizing status whether or not to perform resizing and a resizing direction used when performing resizing. When two-bit data values of each of the upper, the lower, the left, and the right sides are both zeros, the judgment determination unit 56 judges not to perform resizing with respect to the directions concerned. Moreover, when "1" is defined as one of two-bit data values, the judgment determination unit 56 judges by the two-bit values whether to perform resizing, with respect to the direction concerned, to reduce the dimension or to increase the dimension.

In the resize processing step (S112), with respect to each figure, when judged that resizing is to be performed, the resize processing unit 58 resizes the dimension of the figure concerned in the judged resizing direction.

With such a configuration, it even becomes possible to resize a figure which cannot be resized in Embodiment 1 because of its shape.

In the example described above, resizing information of eight bits in total is added to define writing data of each figure, wherein each two bits represent each one of the four directions, it is not limited thereto.

Figure 10:
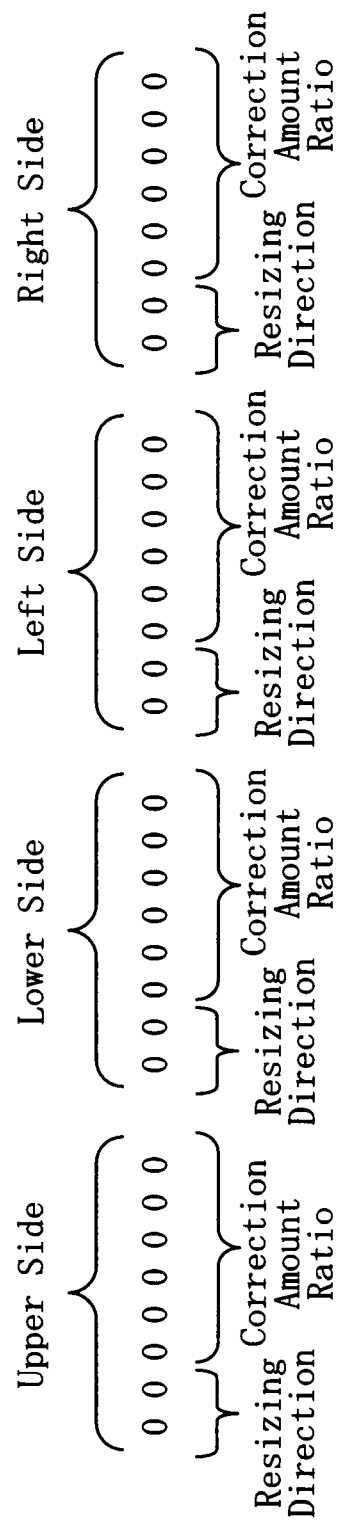
FIG. 10 is a schematic diagram for explaining another example of resizing information according to Embodiment 2.
Figure 11:
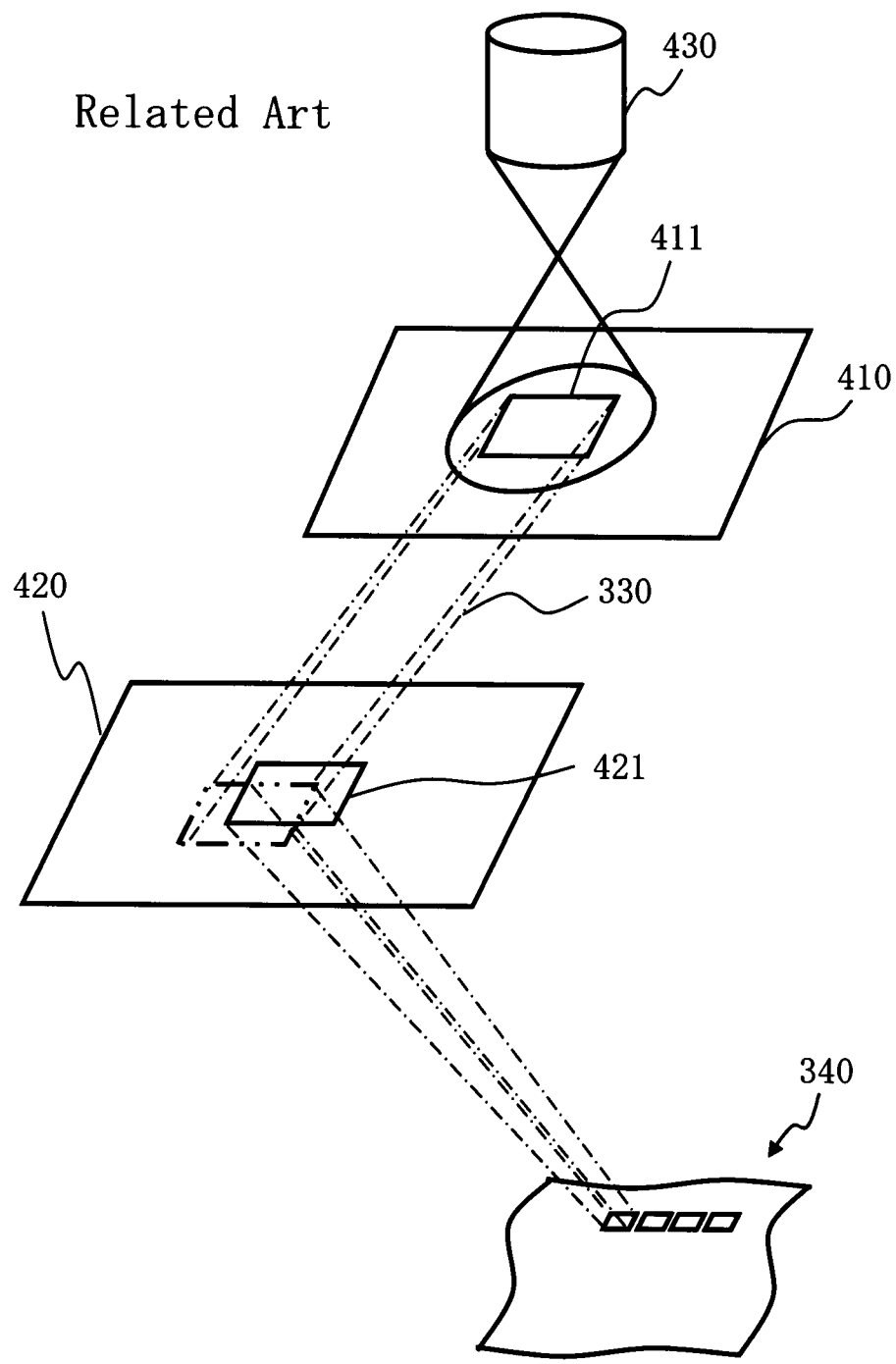
FIG. 11 is a schematic diagram for explaining operations of a variable-shaped electron beam writing apparatus.

FIG. 10 is a schematic diagram for explaining another example of resizing information according to Embodiment 2. FIG. 10 shows the case where, with respect to each direction of each figure, the first two bits represent a resizing status whether or not to perform resizing and a resizing direction, and further, for example, six-bit data representing a ratio of a correction amount to resize is also added. The ratio of the correction amount to resize is not limited to six bits, and it may be other bits. What is necessary is just to be able to identify the ratio of the correction amount for each direction. Moreover, when performing resizing, there is also the case where the amount of resizing is required to be varied for each direction depending on a figure. As described above, in addition to a resizing status whether or not to perform resizing and a resizing direction for each figure, a resizing ratio corresponding to a resize amount to be set for each resizing direction is also defined in resizing information. In the example described above, although resizing is uniformly performed in a defined direction by using the same resize amount, if it is possible to identify the ratio of the correction amount shown in FIG. 10, the judgment determination unit 56 further judges a resizing ratio as the judgment determination step (S110). Then, in the resize processing step (S112), the resize processing unit 58 inputs data indicating an amount of resizing, and, when performing resizing, changes the resize amount in accordance with the resizing ratio. In other words, the resize processing unit 58 performs resizing by using a value obtained by multiplying a resize amount by a judged resizing ratio for each direction of a figure. With such a structure, it becomes possible to perform resizing of higher precision.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A charged particle beam writing apparatus comprising:
 a storage unit configured to store writing data in which there are defined a plurality of figures which are in contact and resizing information indicating, with respect to each of the plurality of figures, a resizing status whether or not to perform resizing and a resizing direction used when performing resizing;

a judgment determination unit configured to input the writing data and judge, with respect to each of the plurality of figures which are in contact, the resizing status whether or not to perform resizing and the resizing direction used when performing resizing, wherein the resizing direction includes an upper, a lower, a left, and a right side, each of the upper, the lower, the left, and the right sides being defined by bit data, the judgment determination unit judges not to perform resizing in a case that bit data values of each of the upper, the lower, the left, and the right sides are both one of zero and one, and the judgment determination unit judges by the bit values whether to perform resizing in a case that another one of zero and one is defined as one of the bit data values;

a resize processing unit configured to resize, with respect to each of the plurality of figures, a dimension of a figure concerned in a judged resizing direction when it is judged to perform resizing; and a writing unit configured to write a pattern onto a target workpiece with using a resized figure and a charged particle beam.

2. The apparatus according to claim 1, wherein, in the resizing information, sum data, in which data of the resizing status whether or not to perform resizing and data of the resizing direction used when performing resizing are defined, is eight bit data.

3. The apparatus according to claim 2, wherein each two bits of the eight bit data are used as the resizing information respectively indicating the resizing direction of an upper side, a lower side, a left side, and a right side.

4. The apparatus according to claim 3, wherein, when the each two bits are both zeros, the judgment determination unit judges not to perform resizing with respect to a direction concerned.

5. The apparatus according to claim 3, wherein the judgment determination unit judges by using the each two bits whether to perform resizing to reduce the dimension or to increase the dimension with respect to a concerned resizing direction.

6. The apparatus according to claim 1, wherein, in the resizing information, there is further defined a resizing ratio corresponding to a resize amount which is set for each resizing direction, and the resize processing unit inputs data indicating the resize amount, and, when performing resizing, changes the resize amount in accordance with the resizing ratio.

7. A charged particle beam writing apparatus comprising:

a storage unit configured to store writing data in which there are defined a plurality of figures which are in contact and contacting direction information indicating, with respect to each of the plurality of figures, a direction of contacting with an adjacent figure;

a judgment determination unit configured to input the writing data and judge, with respect to each of the plurality of figures which are in contact, the direction of contacting with the adjacent figure by using the contacting direction information;

a resize processing unit configured to resize, with respect to each of the plurality of figures which are in contact, a dimension of a figure concerned in a direction other than a judged direction; and a writing unit configured to write a pattern onto a target workpiece with using a resized figure and a charged particle beam.

8. The apparatus according to claim 7, wherein the contacting direction information is defined by four bit data indicating contacts at an upper side, a lower side, a left side and a right side.

9. A charged particle beam writing method comprising:

storing, in a storage unit, writing data in which there are defined a plurality of figures and resizing information indicating, with respect to each of the plurality of figures which are in contact, a resizing status whether or not to perform resizing and a resizing direction used when performing resizing;

reading the writing data from the storage unit, and judging, with respect to each of the plurality of figures which are in contact, the resizing status whether or not to perform resizing and the resizing direction used when performing resizing, wherein the resizing direction includes an upper, a lower, a left, and a right side, each of the upper, the lower, the left, and the right sides being defined by bit data, the judgment determination unit judges not to perform resizing in a case that bit data values of each of the upper, the lower, the left, and the right sides are both one of zero and one, and the judgment determination unit judges by the bit values whether to perform resizing in a case that another one of zero and one is defined as one of the bit data values;

resizing, with respect to each of the plurality of figures, a dimension of a figure concerned in a judged resizing direction when it is judged to perform resizing; and writing a pattern onto a target workpiece with using a resized figure and a charged particle beam.

10. A charged particle beam writing method comprising:

storing, in a storage unit, writing data in which there are defined a plurality of figures and contacting direction information indicating, with respect to each of the plurality of figures which are in contact, a direction of contacting with an adjacent figure;

reading the writing data from the storage unit, and judging, with respect to each of the plurality of figures which are in contact, the direction of contacting with the adjacent figure by using the contacting direction information;

resizing, with respect to each of the plurality of figures which are in contact, a dimension of a figure concerned in a direction other than a judged direction; and writing a pattern onto a target workpiece with using a resized figure and a charged particle beam.

* * * * *